(12) United States Patent
Izumi et al.

(10) Patent No.: US 6,472,666 B2
(45) Date of Patent: Oct. 29, 2002

(54) TWO-DIMENSIONAL IMAGE DETECTOR AND FABRICATION METHOD OF THE SAME

(75) Inventors: Yoshihiro Izumi, Kashihara (JP); Osamu Teranuma, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 3 days.

(21) Appl. No.: 09/766,590

(22) Filed: Jan. 23, 2001

(65) Prior Publication Data

US 2001/0010361 A1 Aug. 2, 2001

(30) Foreign Application Priority Data

Jan. 27, 2000 (JP) ........................................ 2000-019332

(51) Int. Cl.[7] ................................................. G01T 1/24
(52) U.S. Cl. ............................ 250/370.08; 250/370.09; 250/370.12; 250/370.14
(58) Field of Search ..................... 252/478; 250/370.09, 250/370.08, 370.12, 370.14; 257/428, 444

(56) References Cited

U.S. PATENT DOCUMENTS

| | | | |
|---|---|---|---|
| 4,302,521 A | * 11/1981 | Takei et al. | ..................... 430/59 |
| 5,319,206 A | 6/1994 | Lee et al. | |
| 5,681,905 A | * 10/1997 | Mason et al. | ................ 525/438 |
| 5,874,197 A | * 2/1999 | Felten | ..................... 430/281.1 |
| 5,968,694 A | * 10/1999 | Sakai et al. | .................... 430/56 |

FOREIGN PATENT DOCUMENTS

| | | |
|---|---|---|
| JP | 11-211832 A | 8/1999 |
| JP | 11-237478 A | 8/1999 |
| JP | 11-274448 A | 10/1999 |

OTHER PUBLICATIONS

Lee et al, "A New Digital Detector for Projection Radiography", SPIE vol. 2432, Medical Imaging 1995, Physics of Medical Imaging, May 1995, pp. 237–249.

Jeromin et al, "8.4: Application of a–Si Active–Matrix Technology in a X–Ray Detector Pannel", SID 97 Digest, 1997, pp. 91–94.

* cited by examiner

Primary Examiner—Constantine Hannaher
Assistant Examiner—Timothy Moran
(74) Attorney, Agent, or Firm—Nixon & Vanderhye P.C.

(57) ABSTRACT

A two-dimensional image detector that allows charges generated by each photoconductor particle to be smoothly transmitted through a photoconductive layer and thereby ensures effective transmission of charges generated in the photoconductive layer to an active matrix substrate. A two-dimensional image detector of the present invention includes at least an active matrix substrate 1 having a plurality of pixel electrodes 10, and a photoconductive layer 2 laminated on the pixel electrodes 10. The photoconductive layer 2 is composed of a particulate photoconductor, and a binder containing a resin that renders volumetric shrinkage upon reaction. In other words, the foregoing binder contains either (i) a resin that undergoes volumetric shrinkage when it reacts per se (polymerization, cross-linking, or decomposition), (ii) a polymerizable monomer to form a resin, or (iii) a solvent along with the foregoing resin or polymerizable monomer.

8 Claims, 2 Drawing Sheets

TWO-DIMENSIONAL IMAGE DETECTOR AND FABRICATION METHOD OF THE SAME

FIELD OF THE INVENTION

The present invention relates to a two-dimensional image detector that is suitably used for detecting a two-dimensional image formed with light (radiation) such as X-rays, visible light, or infrared rays, and a method for fabricating the same.

BACKGROUND OF THE INVENTION

Conventionally well known as a detector for detecting a two-dimensional image formed with radiation is a two-dimensional image detector in which a plurality of semi-conductor sensors that detect X-rays projected thereto and generate electric charges (electron-hole) are planar arranged, each semiconductor sensor being equipped with an electric switch. The two-dimensional image detector is arranged so as to detect a two-dimensional image by turning on the electric switches line by line successively to read electric charges generated by the semiconductor sensors in each line.

A principle and concrete structure of the foregoing two-dimensional image detector is taught by, for instance, the following documents: D. L. Lee et al., "A New Digital Detector for Projection Radiography", SPICE, 2432, pp.237–249, 1995"; L. S. Jerkin et al., "Application of a-Si Active Matrix Technology in a X-ray Detector Panel", SID 97 DIGEST, pp.91–94, 1997; and the Japanese Publication for Laid-Open Patent Publication No. 342098/1994 (Tokukaihei 6-342098 [Date of Publication: Dec. 13, 1994]). The foregoing two-dimensional image detector is formed in a manner such that a photoconductive layer that absorbs X-rays to generate electric charges is formed on an active matrix substrate that is a substrate provided with a plurality of electrode wires arranged in XY matrix, switching elements and pixel electrodes provided at intersections of the foregoing electrode wires, and further, bias electrodes are provided on the foregoing photoconductive layer.

Then, for example, the foregoing document discloses an arrangement in which a-Se (amorphous selenium) that has good sensitivity with respect to X-rays and is easily formed on a large-area substrate is used as a material for forming the photoconductive layer. a-Se exhibits a high X-ray absorption factor and a high ratio of conversion of X-rays to electric charges (hereinafter referred to as ray-charge conversion ratio), and also, it is directly formed on an active-matrix substrate at a relatively low temperature by vapor deposition.

To improve the S/N ratio of the two-dimensional image detector, the quantity of electric charges generated by X-ray absorption should be increased. To increase the quantity of electric charges, it is necessary to form the photoconductive layer to a thickness of about 500 $\mu$m to 1500 $\mu$m. Formation of such a thick photoconductive layer by vapor deposition, however, takes long time, and further, management of the process is complex. This causes the productivity to become extremely low, thereby causing manufacturing costs of the two-dimensional image detector. Moreover, in the method in which a photoconductive layer is directly provided on the active matrix substrate, the active matrix substrate is heated upon formation of the photoconductive layer. Therefore, the heat resistance (heat resistance temperature) of the active matrix substrate has to be taken into consideration. Therefore, by the foregoing method, it is impossible to use a material that has to be laminated (for instance, CdTe, CdZnTe) as a material forming the photoconductive layer.

Then, as a method to solve the foregoing problem, the Japanese Publication for Laid-Open Patent Application No. 211832/1999 (Tokukaihei 11-211832 [Date of Publication: Aug. 6, 1999]) teaches a method for forming a photoconductive layer in a coating process, rather than vapor deposition. More specifically, in the foregoing method, a particle-dispersed material that is formed by dispersing a particle-form photoconductor in a binder such as resin with insularity is coated to a thickness of about 700 $\mu$m to 3000 $\mu$m over the active matrix substrate, to form a photoconductive layer. By this method, any one of various materials that exhibit high X-ray absorption factors and high ray-charge conversion ratios (photoconductive materials), apart from the aforementioned a-Se, can be used as the material composing the photoconductor. Therefore, by combining such a material and a binder such as resin, a photoconductive layer can be formed. Incidentally, since the foregoing method allows a photoconductive layer to be formed in a short time, it is considered that a high productivity can be achieved, while the manufacturing cost of the two-dimensional image detector can be reduced.

By the method taught by Tokukaihei 11-211832 mentioned above, a photoconductive layer is made of a particle-dispersed material that is formed by dispersing a particle-form photoconductor in a binder with insularity such as resin. In the case where the photoconductor particles are uniformly dispersed in an insulating binder, the photoconductor particles become hardly in contact with each other, and electric charges generated at each photoconductor particle are not smoothly conducted through the photoconductive layer. Therefore, there arises a problem that electric charges generated at the photoconductive layer cannot be conducted effectively to the active matrix substrate.

On the other hand, in view of an arrangement of a copying-machine-use photosensitive drum, the Japanese Publication for Laid-Open Patent Application No. 11-237478 (Tokukaihei 11-237478 [Date of Publication: Aug. 31, 1999]) discloses a method in which two layers of a charge transporting layer and a photoconductive layer are laminated in the stated order on an active matrix substrate so as to effectively conduct electric charges generated in the photoconductive layer to the active matrix substrate, that is, a method for improving charge collecting efficiency. The foregoing photoconductive layer is made of a particle-dispersed substance that is formed by dispersing a particle-form photoconductor in a binder with insularity such as resin. However, to produce a two-dimensional image detector that is to detect X-rays, it is necessary to form the photoconductive layer to a thickness of about 700 $\mu$m to 3000 $\mu$m, to improve the X-ray absorption factor. On the contrary, about 0.1 $\mu$m to 1 $\mu$m is sufficient as a thickness of the charge production layer (equivalent to the photoconductive layer) of the copying-machine-use photosensitive drum.

In the case where the photoconductive layer with the foregoing thickness is formed, however, the electric charges generated by the photoconductor particles tend to be prevented by the insulating binder from being conducted. In other words, electric charges generated by the photoconductor particles cannot be conducted smoothly through the photoconductive layer. Therefore, there arises a problem such that the electric charges generated in the photoconductive layer cannot be efficiently conducted to the active matrix substrate through the charge transporting layer.

In other words, in the above-described two-dimensional image detector equipped with the photoconductive layer, electric charges generated in the photoconductive layer cannot be efficiently conducted to the active matrix substrate. Thus, there is a problem such that it is difficult to provide a two-dimensional image detector that is superior in sensitivity with respect to X-rays, visible light, infrared, and other light (radiation).

SUMMARY OF THE INVENTION

The present invention was made in light of the foregoing problems of the prior art, and an object of the present invention is to provide a two-dimensional image detector and a producing method of the same, the two-dimensional image detector being arranged so that charges generated by each particle of a photoconductor are smoothly transmitted through a photoconductive layer even in the case where the photoconductive layer is formed with a dispersion in which the particulate photoconductor is dispersed in a binder such as resin with insularity, thereby resulting in efficient transmission of charges generated in the photoconductive layer to the active matrix substrate, that is, a two-dimensional image detector superior in sensitivity to light (radiation) such as X-rays, visible light, or infrared rays.

A first object of the present invention is to provide a two-dimensional image detector in which charges generated at each photoconductor particle are smoothly transmitted through the photoconductive layer, thereby realizing efficient transmission of charges generated in the photoconductive layer to the active matrix substrate.

To achieve the foregoing first object, a two-dimensional image detector in accordance with the present invention includes at least an active matrix substrate having a plurality of pixel electrodes, and a photoconductive layer laminated on the pixel electrodes, so that the photoconductive layer is made of a mixture of a particulate photoconductor and a binder containing a resin that renders volumetric shrinkage upon reaction.

According to the foregoing arrangement, the photoconductive layer is made of a mixture of a particulate photoconductor and a binder containing a resin that renders volumetric shrinkage upon reaction. Therefore, after the mixture is laminated on the active matrix substrate by coating, heat transfer (a photoconductive layer is formed on another substrate beforehand then transferred to the active matrix substrate) or the like, reaction (polymerization, crosslinking, or decomposition) of the resin can be promoted either by subjecting the mixture to heat treatment, irradiating the same with light (application of thermal energy or optical energy), or by allowing the same to stand in-atmosphere. Therefore, a photoconductive layer can be easily formed on the active matrix substrate. Since the resin renders volumetric shrinkage depending on the material of the binder upon the foregoing processing operation, particles of the photoconductor tend to approach each other, contacting and flocculating, even in the case where the particulate photoconductor is dispersed uniformly in the binder. This results in smooth transmission of charges generated at each particle of the photoconductor through the photoconductive layer, thereby realizing efficient transmission of charges generated in the photoconductive layer to the active matrix substrate. This enables provision of a two-dimensional image detector superior in the sensitivity to light (radiation) such as X-rays, visible light, infrared rays, etc.

Furthermore, the photoconductive layer 2 can be formed on the active matrix substrate 1 by a method other than vapor deposition that includes an evaporating process, that is, more concretely, by coating or heat transfer. Therefore, materials, forming methods, conditions for formation, etc. can be appropriately selected from a wider range (the range of selection is widened), as compared with the case where the photoconductive layer 2 is formed by vapor deposition on the active matrix substrate 1. In other words, since the photoconductive layer 2 can be formed without use of vapor deposition, the materials forming the photoconductive layer 2, the method and conditions of formation of the photoconductive layer 2, etc. can be appropriately selected from wider ranges of materials, method, and conditions, without the need to take the heat resistance of active matrix substrate, for instance. Therefore, various materials (photoconductive materials) that are not suitable for application by vapor deposition can be used as materials of the photoconductive layer 2, and the productivity of the photoconductive layer 2 can be improved. Furthermore, it is superior in uniformity of the film thickness and composition, and moreover, it enables easy formation of the photoconductive layer 2 to a thickness (film thickness) of about 700 $\mu$m to 3000 $\mu$m.

To achieve the aforementioned first object, a two-dimensional image detector in accordance with the present invention includes at least an active matrix substrate having a plurality of pixel electrodes, and a photoconductive layer laminated on the pixel electrodes, wherein the photoconductive layer is made of a mixture of a particulate photoconductor and a binder containing a charge transport medium.

According to the foregoing arrangement, the photoconductive layer is composed of a particulate photoconductor and a binder containing charge transport medium. Therefore, by applying a method such as coating, heat transfer (a photoconductive layer is formed on another substrate beforehand then transferred by heat to the active matrix substrate) or the like, a photoconductive layer can be formed on the active matrix substrate easier. Since the binder contains the charge transport medium, charges generated at each photoconductive particle are smoothly transmitted through the photoconductive layer even in the case where the particulate photoconductor is uniformly dispersed in the binder. Therefore, the charges generated in the photoconductive layer are efficiently transmitted to the active matrix substrate. This enables to provide a two-dimensional image detector superior in sensitivity to light (radiation) such as X-rays, visible light, infrared rays, etc.

The second object of the present invention is to provide a method for fabricating a two-dimensional image detector that provides smooth transmission of charges generated at each particle of the photoconductor through the photoconductive layer, thereby realizing efficient transmission of charges generated in the photoconductive layer to the active matrix substrate.

To achieve the foregoing second object, a method for fabricating a two-dimensional image detector of the present invention includes the step of laminating a photoconductive layer that is made of a mixture of a particulate photoconductor and a binder containing a resin that renders volumetric shrinkage upon reaction, on an active matrix substrate having a plurality of pixel electrodes.

To achieve the foregoing second object, another method for fabricating a two-dimensional image detector of the present invention includes the step of laminating a photoconductive layer that is made of a mixture of a particulate photoconductor and a binder containing a charge transfer medium, on an active matrix substrate having a plurality of pixel electrodes.

The foregoing arrangement enables to provide a method for fabricating a two-dimensional image detector that renders the aforementioned various effects.

For a fuller understanding of the nature and advantages of the invention, reference should be made to the ensuing detailed description taken in conjunction with the accompanying drawings.

DESCRIPTION OF THE PREFERRED EMBODIMENTS

In the present invention, it should be noted that examples of a "resin that renders volumetric shrinkage upon reaction" include, apart from a resin that exhibits volumetric shrinkage upon reaction of itself (polymerization, cross-linking, decomposition, etc.), a resin formed with a polymerizable monomer contained in a binder, which exhibits volumetric shrinkage when the polymerizable monomer is polymerized, and a resin that is formed with the foregoing resin or polymerizable monomer contained in a binder along with a solvent and that exhibits volumetric shrinkage when the solvent evaporates (volatilizes).

Furthermore, in the present invention, examples of a "binder containing a charge transport medium" include, apart from binders each being formed with a charge transport medium mixed in a resin, binders that themselves have functions as charge transport media.

First Embodiment

Figure 1:
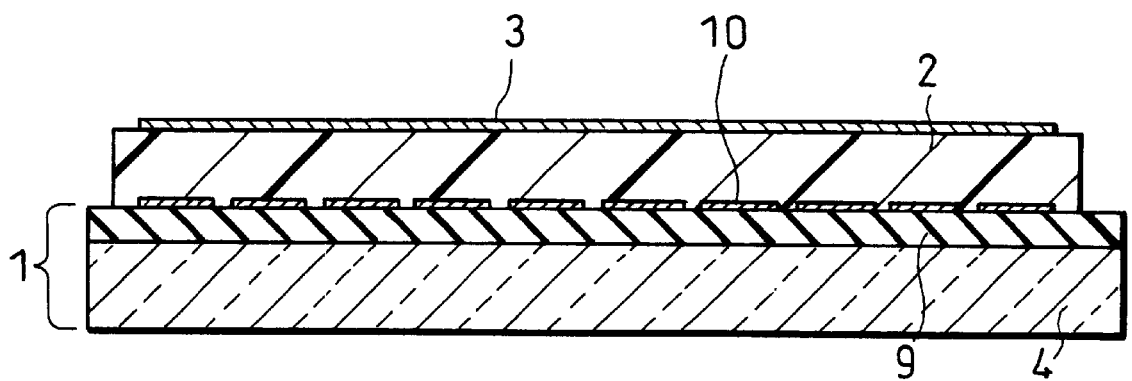
FIG. 1 is a cross-sectional view schematically illustrating an arrangement of a two-dimensional image detector in accordance with a first embodiment of the present invention.
Figure 2:
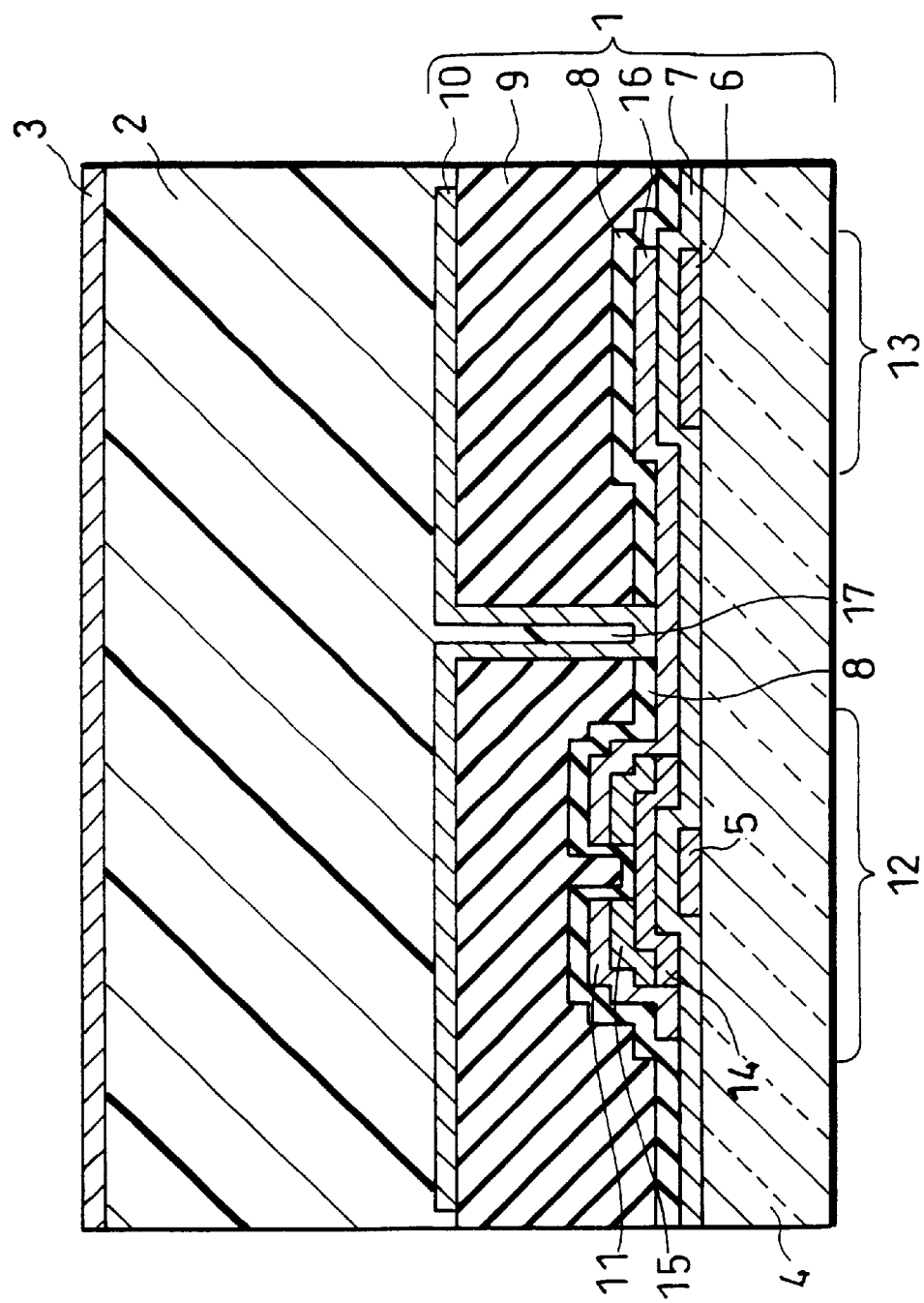
FIG. 2 is a cross-sectional view illustrating an arrangement of a principal part (pixel) of the foregoing two-dimensional image detector.

The following description will explain an embodiment of the present invention while referring to FIGS. 1 and 2. Incidentally, a device for detecting X-rays, that is, an X-ray two-dimensional image detector is taken as an example of a two-dimensional image detector.

In an X-ray two-dimensional image detector in accordance with the present embodiment, a principal part thereof is formed by laminating a photoconductive layer 2 and a common electrode 3 on an active matrix substrate 1.

The active matrix substrate 1 is formed by laminating, on a glass substrate 4, scanning lines, signal lines (not shown), gate electrodes 5, charge storing capacitor electrodes (Cs electrodes) 6, gate insulating films (storing capacitors) 7, a-Si layers (i layers) 14, a-Si layers ($n^+$ layers) 15, source electrodes 11, drain electrodes 16, first insulating protect films 8, second insulating protect films 9, pixels electrodes 10, and the like. A TFT (thin film transistor) element 12 as a switching element is composed of the gate electrode 5, the gate insulating film 7, the a-Si layers 14 and 15, the source electrode 11, and the like, while a charge storing capacitor (Cs) 13 is composed of the charge storing capacitor electrode 6, the gate insulating film 7, the drain electrode 16, and the like. A non-alkali glass is preferable as the foregoing glass substrate 4.

The foregoing gate electrode 5 is connected with the scanning line, while the source electrode 11 is connected with a signal line. The scanning lines and signal lines as electrode wires are provided in lattice form on the glass substrate 4. The foregoing TFT elements 12 are disposed at lattice points (intersections) of the foregoing electrode wires thus arranged in lattice form. The pixel electrode 10 is connected with the source electrode 11 (signal line) via the TFT element 12. Therefore, these electrode wires, the TFT element 12, and the pixel electrode 10 constitute a pixel array layer as an image detection region. Thus, the active matrix substrate 1 is composed of the glass substrate 4 and the pixel array layer formed thereon. In other words, the active matrix substrate 1 is arranged basically identical to an active matrix substrate 1 commonly used in an LCD device, etc.

The area of the image detection region of the active matrix substrate 1 is sufficiently, for example, a square of about 430 mm×430 mm with a pixel pitch of around 150 $\mu$m when fabricating an X-ray two-dimensional image detector used for X-ray radiography of the human body.

The gate electrodes 5 and the charge storing capacitor electrodes 6 are formed, for example, by a spattering vapor deposition method, and made of a metal film such as tantalum or aluminum which has been patterned into a predetermined shape. The thickness of the metal film is to be around 300 nm but is not particularly limited. Note that, the scanning lines are formed together with the gate electrodes 5.

The gate insulating film 7 is made of an SiNx film or SiOx film formed by the CVD method. The thickness of the gate insulating film 7 is to be around 350 nm but is not particularly limited.

The a-Si layer (i layer) 14 and a-Si layer ($n^+$ layer) 15 are formed by being patterned into a predetermined shape on the gate insulating film 7 on the gate electrodes 5. The a-Si layer 14 and 15 are made of, for example, an a-Si film formed by the CVD method. The thickness of the a-Si layer (i layer) 14 is to be around 100 nm, and the thickness of the a-Si layer ($n^+$ layer) 15 is to be around 40 nm, but are not particularly limited.

The source electrodes 11 and the drain electrodes 16 are formed, for example, by the spattering vapor deposition method, and are made of a metal film such as tantalum or aluminum which has been patterned into a predetermined shape. The thickness of the metal film is to be around 300 nm but is not particularly limited. Note that, the signal lines are formed together with the drain electrodes 16.

The first insulating protect film 8 is made of, for example, an SiNx film formed by the CVD method. The thickness of the first insulating protect film 8 is to be around 300 nm but is not particularly limited.

The second insulating protect film 9 is, for example, an organic insulating film made of acrylic resin or other material having photoconductivity. The thickness of the second insulating protect film 9 is not particularly limited. On predetermined portions of the second insulating protect film 9 are formed contact holes 17 for shorting the drain electrodes 16 and the pixel electrodes 10.

The pixel electrodes 10 are formed, for example, by the spattering vapor deposition method, and is made of an ITO film which has been patterned into a predetermined shape. The thickness of the ITO film is to be around 150 nm but not particularly limited. The pixel electrodes 10 are shorted to the drain electrodes 16 through the contact holes 17 provided through the second insulating protect film 9.

The foregoing photoconductive layer 2 is formed with a mixture of particulate photoconductor and a binder containing a resin that renders volumetric shrinkage upon reaction. More concretely, the photoconductive layer 2 is made of a dispersion in which particulate photoconductor is uniformly dispersed at a specific ratio in a binder used for maintaining a sheet-like shape.

The photoconductive layer 2 is formed in the following manner: adopting the coating method or the heating transfer method (a method such that a photoconductive layer is formed beforehand on another substrate and is thereafter transferred by heat to the active matrix substrate), the foregoing mixture is laminated on the active matrix substrate 1, followed by application of heat treatment or irradiation with light (application of thermal energy or optical energy), or aging in atmosphere, so that reaction of resin (polymerization reaction, cross-linking reaction, decomposition reaction, etc) should be promoted.

Specifically, the material of the photoconductor may be, but not limited to, for example, inorganic materials such as CdTe, CdZnTe, CdSe, CdS, ZnO, $PbI_2$, $TlI_2$, PbO, $HgI_2$, $Bi_{12}GeO_{20}$, $Bi_{12}SiO_{20}$, Se, SeAs, Si, SiC, SiGe, GaAs, and GaN; and organic materials such as titanyl phthalocyanine, metal phthalocyanines pigments, non-metal phthalocyanine, perylenes pigments, polycyclic quinolines pigments, squaliniums pigments, azuleniums pigments, thiapyryliums pigments, and trisazo pigment. These materials may be used individually or in combination of two or more kinds. That is, these materials are used according to the wavelength of the light (radiation) such as X-ray, visible light, or infra red ray, i.e., by suitably selecting a material having superior sensitivity to the light to be detected. In the case of fabricating the X-ray two-dimensional image detector, it is particularly preferable to use, among the various materials as exemplified above, CdZnTe which has superior sensitivity to the X-ray at normal temperature.

The method for processing the photoconductor in particle form is not particularly limited. The particle diameter may be set according to materials, usage, combination with a binder (resin), etc. of the photoconductor, though preferably being set in a range of 0.01 μm to 0.5 μm, or more preferably in a range of 0.01 μm to 0.1 μm. By adjustment such that most of the particles should have diameters in the foregoing range, the particulate photoconductor can be dispersed uniformly in the binder, resulting in that further uniform photoconductive layer 2. Furthermore, charges generated at each particle of the photoconductor is smoothly conducted through the photoconductive layer 2, realizing further efficient transmission of charges generated in the photoconductive layer 2 to the active matrix substrate 1.

The foregoing binder contains (i) a resin that renders reaction of itself (polymerization, cross-linking, or decomposition) thereby causing volumetric shrinkage, (ii) polymerizable monomer that forms a resin, or (iii) a solvent along with the foregoing resin or the foregoing polymerizable monomer. The foregoing polymerizable monomer is a monomer that is polymerized while shrinking in volume, to form a resin. The foregoing solvent is used as required, to improve the workability upon lamination of a mixture of the photoconductor and the binder on the active matrix substrate 1 by coating or heat transfer, or alternatively, to improve dispersibility of the photoconductor in the binder. Evaporation (volatilization) of the foregoing solvent causes volumetric shrinkage. Furthermore, the foregoing binder may contain a polymerization initiator or a curing agent as required. Incidentally, a polymerization initiator or a curing agent is not particularly limited as long as it is a compound that does not adversely affect the function of the photoconductive layer 2.

Examples of the foregoing resin that renders volumetric shrinkage upon polymerization, cross-linking (such as curing), decomposition, etc. concretely include (i) polymerized resin such as acrylic resin, urethane resin, epoxy resin, or silicone resin, and (iiI) mixture of any of these resins, though it is not particularly limited. A sol-gel material of the inorganic configuration or the inorganic-organic hybrid configuration that renders volumetric shrinkage upon heated/annealed may be used as the foregoing resin. Therefore, in the category of resin that "renders volumetric shrinkage upon reaction" in the present invention, the foregoing sol-gel material is included. Incidentally, as to the resin that can decompose, volumetric shrinkage is caused by desorption of low-molecular-weight components from the resin and evaporation (volatilization) of the same.

The foregoing polymerizable monomer is a monomer that, when polymerized into a resin, comes to have a volume smaller than that in the polymerizable monomer state, and it is not particularly limited, as long as it is a compound that, even if remaining in a non-reacted state, does not adversely affect the function of the photoconductive layer 2.

Examples of a material of the binder in case containing a polymerizable monomer include, apart from the aforementioned polymerizable resin, styrene-butadiene-styrene (SBS) resin, styrene-ethylene-butadiene-styrene (SEBS) resin, polyvinylbutyral resin, polyvinyl alcohol (PVA) resin, polychloroethylene resin, methacrylic resin, polyimide resin, phenol resin, polycarbonate resin, polyester resin, polyamide resin, polystyrene resin, polyethylene resin, polypropylene resin, phenoxy resin, and mixtures of these resins, which do not undergo volumetric shrinkage. However, the material of binder may be appropriately selected according to the type of the foregoing polymerizable monomer, and is not particularly limited.

The foregoing solvent may be any compound as long as it dissolves the foregoing resin or polymerizable monomer, and even if remaining, it does not adversely affect the function of the photoconductive layer 2. Examples of the foregoing solvent include the following organic solvents and mixtures of the same: halogens solvent such as dichloromethane, 1,2-dichloroethane; ketones solvent such as acetone; esters solvent; ether-based solvent such as tetrahydrofuran (THF), 1,4-dioxane; alcohols solvent; aromatic hydrocarbons solvent such as benzene, toluene, xylene; non-protones polar solvent such as N,N-dimethyl formamide, dimethyl sulfoxide. The solvent may be, however, appropriately selected according to the type of the foregoing resin or the polymerizable monomer and is not particularly limited.

The degree of volumetric shrinkage provided by the foregoing resin, polymerizable monomer, solvent contained in the binder is preferably in a range of 5% to 15% as compared with the state prior to the shrinkage. This allows photoconductor particles to become close to each other, easily contacting and flocculating, even in the case where the particulate photoconductor is dispersed uniformly in the binder. Incidentally, the foregoing degree of volumetric shrinkage is a value experimentally determined.

The method for dispersing the particulate photoconductor in the binder, that is, the method for producing the dispersion, is not particularly limited, but the techniques such as agitating or ultrasonic dispersing are preferable. Further, the ratio of the photoconductor to the binder may be set appropriately according to the materials of the photoconductor and the binder and is not particularly limited, but the ratio is preferably in a range of 50 percent by mass to 90 percent by mass, or more preferably in a range of 60 percent by mass to 80 percent by mass. By adjusting the foregoing ratio of the photoconductor in the foregoing range, the particulate photoconductor can be more uniformly dispersed in the binder, allowing formation of more homogeneous photoconductor layer 2. This allows charges generated by each photoconductor particle to be more smoothly transmitted in the photoconductor layer 2, thereby realizing more effective transmission to charges generated in the photoconductor layer 2 to the active matrix substrate 1.

Additives such as radiation-resistant additives based on aromatic amines or phenols to improve the X-rays-resistant property of the photoconductive layer 2 may be added to the binder as required. The usage and adding method of such an additive is not particularly limited. The foregoing binder is stabilized upon heat treatment or projection of light thereto depending on the material of the same, thereby forming the sheet-like photoconductor layer 2.

Examples of the method for forming the photoconductive layer 2 on the active matrix substrate 1 include (i) coating methods such as roll coating, offset printing, and spraying, and (ii) heat transfer in which a photoconductive layer is formed on another substrate beforehand and is transferred by heat to the active matrix substrate, though it is not particularly limited. The thickness of the photoconductive layer 2 may be set according to the materials of the photoconductor and binder and is not particularly limited, but it is preferably in a range of about 700 $\mu$m to 3000 $\mu$m, and is more preferably in a range of 1000 $\mu$m to 2500 $\mu$m.

Incidentally, to improve the S/N ratio of a two-dimensional image detector, an inhibition layer that inhibits injection of various charges to the photoconductive layer 2 is preferably provided on either an upper surface or a lower surface of the photoconductive layer 2 (between the active matrix substrate and the photoconductive layer), or more preferably on both surfaces (upper and lower surfaces) thereof. The material of the inhibition layer and the method for forming the same are not particularly limited.

The common electrode 3 is composed of a film of gold (Au) formed by vapor deposition, for instance. The thickness of the foregoing gold film, though not particularly limited, is sufficiently about 200 nm.

An example of the method of fabrication of the two-dimensional image detector configured as above will be described below, with reference to FIG. 2. However, the method of fabrication of the two-dimensional image detector is not limited to that exemplified below.

First of all, as shown in FIG. 2, a metal film, about 300 nm thick, is formed by sputtering deposition on the glass substrate 4, then patterned to a desired shape, so that the gate electrode 5 and the storing capacitor electrode 6 are formed (STEP 1). Next, a SiNx film or a SiOx film is formed to a thickness of about 350 nm by CVD on the foregoing glass substrate 4, so that the gate insulating film 7 is formed (STEP 2).

After an a-Si film is formed to a thickness of about 100 nm by CVD on the gate insulating film 7 above the gate electrode 5, it is patterned to a desired shape, so that the a-Si layer (i layer) 14 is formed. On top of that, an a-Si film is formed to a thickness of about 400 nm by CVD and is patterned to a desired shape, so that the a-Si layer (n$^+$ layer) 15 is formed (STEP 3).

Subsequently, a metal film is formed to a thickness of about 300 nm by sputtering deposition on the foregoing gate insulating film 7 and is patterned to a desired shape, so that the source electrode 11 and the drain electrode 16 are formed (STEP 4). Through this process, the TFT element 12 and the charge storing capacitor 13 are formed.

Next, a SiNx film is formed to a thickness of about 300 nm by CVD on these electrodes 11 and 16, and the SiNx film is removed at positions where the contact holes 17 are to be formed later, so that the first insulating protective film 8 is formed (STEP 5).

By providing an organic insulating film to a predetermined thickness on the first insulating protective film 8, the second insulating protective film 9 is formed. Then, the contact holes 17 are formed at predetermined positions on the second insulating protective film 9 by patterning by photolythography (STEP 6).

Subsequently, an ITO film is formed to a thickness of about 150 nm by sputtering deposition on the second insulating protective film 9 and is patterned to a desired shape, so that the pixel electrode 10 is formed. Here, the drain electrode 16 and the pixel electrode 10 are short-circuitted through the contact hole 17 provided in the second insulating protective film 9 (STEP 7).

By carrying out the foregoing STEPS 1 through 7 in the stated order, the active matrix substrate 1 having the TFT element 12 and the charge storing capacitor 13 is fabricated. Incidentally, the method for fabrication of the active matrix substrate 1 is not limited to that exemplified above. The active matrix substrate 1 may be equipped with any one of various types of non-linear elements instead of the foregoing TFT element 12. That is, the configuration and material of the switching element are not limited to the foregoing configuration (TFT configuration) and material described above.

Subsequently, the photoconductive layer 2 in a sheet form made of a binder with particulate photoconductor uniformly dispersed therein is provided to a predetermined thickness on the active matrix substrate 1. More specifically, a mixture of a photoconductor and a binder is laminated on the active matrix substrate 1 by, for instance, coating (STEP 8). Next, the mixture is either subjected to heat treatment, irradiated with light (application of thermal energy or optical energy), or allowed to stand in atmosphere, depending on the material of the binder, so that the binder is stabilized (STEP 9). The operation of forming the photoconductive layer 2 on the active matrix substrate 1 is completed.

Thereafter, a metal film is formed to a thickness of about 200 nm by vapor deposition on the photoconductive layer 2, so that the common electrode 3 is formed (STEP 10). Through this process, the two-dimensional image detector is fabricated.

As described above, a two-dimensional image detector in accordance with the present embodiment includes at least an active matrix substrate 1 having a plurality of pixel electrodes 10, and a photoconductive layer 2 laminated on the pixel electrodes, wherein the photoconductive layer 2 is made of a mixture of a particulate photoconductor and a binder containing a resin that renders volumetric shrinkage upon reaction.

The foregoing arrangement in which the mixture is laminated on the active matrix substrate 1 by coating or heat transfer then processed allows reaction of the resin to be promoted. Therefore, the photoconductor layer 2 is easily formed on the active matrix substrate 1. Here the resin renders volumetric shrinkage upon reaction, thereby causing particles of the photoconductor to become closer to each other, easily contacting and flocculating, even in the case where the particulate photoconductor is dispersed uniformly in the binder. Therefore, charges generated at each photoconductor particle are smoothly transmitted through the photoconductive layer 2, resulting in smooth transmission of the charges generated in the photoconductive layer 2 to be efficiently transmitted to the active matrix substrate 1. This enables to provide a two-dimensional image detector superior in sensitivity to light (radiation) such as X-rays, visible light, infrared rays, etc.

Furthermore, the photoconductive layer 2 can be formed on the active matrix substrate 1 by a method other than vapor deposition that includes an evaporating process, that is, more concretely, by coating or heat transfer. Therefore, materials, forming methods, conditions for formation, etc. can be appropriately selected from a wider range (the range of selection is widened), as compared with the case where the photoconductive layer 2 is formed by vapor deposition on the active matrix substrate 1. In other words, since the photoconductive layer 2 can be formed without use of vapor deposition, the materials forming the photoconductive layer 2, the method and conditions of formation of the photoconductive layer 2, etc. can be appropriately selected from wider ranges of materials, method, and conditions, without the need to take the heat resistance of active matrix substrate, for instance. Therefore, various materials (photoconductive materials) that are superior in sensitivity to X-rays but are not suitable for application by vapor deposition can be used as materials of the photoconductive layer 2, and the productivity of the photoconductive layer 2 can be improved. Furthermore, it is superior in uniformity of the film thickness and composition, and moreover, it enables easy formation of the photoconductive layer 2 to a thickness (film thickness) of about 700 $\mu$m to 3000 $\mu$m.

The two-dimensional image detector of the present invention is preferably arranged so that particles of the photoconductor have a diameter in a range of 0.01 $\mu$m through 0.5 $\mu$m.

The two-dimensional image detector is preferably arranged so that a ratio of the photoconductor to the binder is in a range of 50 percent by mass to 90 percent by mass.

The foregoing arrangements allows charges generated at each photoconductive particle to be more smoothly transmitted through the photoconductive layer, thereby realizing more effective transmission to charges generated in the photoconductor layer to the active matrix substrate. This enables to provide a two-dimensional image detector further superior in sensitivity to light (radiation) such as X-rays, visible light, infrared rays, etc.

Second Embodiment

The following description will explain another embodiment of the present invention. The members having the same structure (function) as those in the first embodiment will be designated by the same reference numerals and their description will be omitted.

A two-dimensional image detector in accordance with the present embodiment is an X-ray two-dimensional image detector whose photoconductive layer 2 is made of a mixture of a particulate photoconductor and a binder containing a charge transport medium. More concretely, the photoconductive layer 2 is made of a dispersion that is formed by dispersing a particulate photoconductor in a binder used for maintaining the sheet-like form at a specific mixture rate. The photoconductive layer 2 is formed by laminating the foregoing mixture on the active matrix substrate 1 by, for instance, coating or heat transfer.

The foregoing binder contains a charge transport medium or itself possesses a function as the charge transport medium. Further, the binder may contain, for instance, a solvent mentioned above as required. The solvent is employed to improve workability in laminating the mixture of a photoconductor and a binder on the active matrix substrate 1 by coating or heat transfer, or to improve the dispersibility of a photoconductor in a binder. The solvent is removed by evaporation (volatilization) at a suitable timing at a stage of forming the photoconductive layer 2.

Concrete examples of the foregoing charge transport medium include the following chemical compounds, in the case where an X-ray two-dimensional image detector is fabricated: (i) polymer compounds including inorganic compounds such as polysilane, and organic compounds such as polysilane compounds (derivatives) and polyvinylcarbazol; low-molecular-weight compounds such as hydrazone, oxadiazole, stilbene, and triphenylmethane, and their derivatives, though the charge transport medium is not particularly limited and may be any one as long as it is a compound possessing a charge transporting ability.

Concrete examples of the foregoing binder in the case where it contains the charge transport medium include the aforementioned resins that do not render volumetric shrinkage, epoxy resins, and silicone resins, though it is not particularly limited and may be any one as long as it is a chemical compound that allows the foregoing charge transport medium to be mixed and dispersed uniformly therein. Incidentally, the polysilane compounds are capable of forming mixtures with a particulate photoconductor without employing the aforementioned materials, since the foregoing polysilane compounds per se function as binders.

In the case where the binder is composed of the charge transport medium along with the foregoing materials, the ratio of the charge transport medium in the binder is not particularly limited and may be set according to the type of the charge transport medium and the foregoing materials, but it is preferably in a range of 20 percent by mass to 80 percent by mass. The method for mixing and dispersing the charge transport medium in the foregoing material, that is, the method for producing the binder, is not particularly limited, but the techniques such as agitating or ultrasonic dispersing are preferable.

The particle diameter of the photoconductor particles in the present embodiment may be set according to the material and usage of the photoconductor, the combination thereof with a binder, etc. and is not particularly limited, but it is preferably in a range of 0.1 $\mu$m to 5 $\mu$m, or more preferably in a range of 0.15 $\mu$m to 3 $\mu$m. Further, the ratio of the photoconductor to the binder may be set appropriately according to the materials of the photoconductor and the binder and is not particularly limited, but the ratio is preferably in a range of 1 percent by mass to 80 percent by mass, or more preferably in a range of 5 percent by mass to 60 percent by mass. By adjustment such that most of the particles should have diameters in the foregoing range, or by adusting the ratio of the photoconductor in the foregoing range, the particulate photoconductor can be dispersed uniformly in the binder, resulting in further uniform photoconductive layer 2. Furthermore, charges generated at each particle of the photoconductor is smoothly conducted through the photoconductive layer 2, realizing further efficient transmission of charges generated in the photoconductive layer 2 to the active matrix substrate 1.

The other configuring members (configuration) of the two-dimensional image detector in accordance with the present embodiment are identical to those of the two-dimensional image detector of the above-described first embodiment.

As described above, a two-dimensional image detector of the present invention includes at least an active matrix substrate 1 having a plurality of pixel electrodes 10, and a photoconductive layer 2 laminated on the pixel electrodes 10, wherein the photoconductive layer 2 is made of a mixture of a particulate photoconductor and a binder containing a charge transport medium.

The foregoing arrangement, when employing a method such as coating or heat transfer, allows the photoconductive layer 2 to be easily formed on the active matrix substrate 1. Since the binder contains the charge transport medium, charges generated at each photoconductive particle are smoothly transmitted through the photoconductive layer 2 even in the case where the particulate photoconductor is uniformly dispersed in the binder. Therefore, the charges generated in the photoconductive layer 2 are efficiently transmitted to the active matrix substrate 1. This enables to provide a two-dimensional image detector superior in sensitivity to light (radiation) such as X-rays, visible light, infrared rays, etc. Furthermore, like in the foregoing first embodiment, the materials forming the photoconductive layer 2, the method and conditions of formation of the photoconductive layer 2, etc. can be appropriately selected from wider ranges of materials, method, and conditions.

The two-dimensional image detector of the present invention is preferably arranged so that particles of the photoconductor have a diameter in a range of 0.1 $\mu$m through 5 $\mu$m.

The two-dimensional image detector of the present invention is preferably arranged so that a ratio of the photoconductor to the binder is in a range of 1 percent by mass to 80 percent by mass.

According to the foregoing arrangement, charges generated at each photoconductive particle are more smoothly transmitted through the photoconductive layer, therefore, the charges generated in the photoconductive layer are more efficiently transmitted to the active matrix substrate. This enables to provide a two-dimensional image detector further superior in sensitivity to light (radiation) such as X-rays, visible light, infrared rays, etc.

Third Embodiment

The following description will explain another embodiment of the present invention. Incidentally, the members having the same structure (function) as those in the second embodiment will be designated by the same reference numerals and their description will be omitted.

A two-dimensional image detector in accordance with the present embodiment is a device intended for detection of visible light, that is, a visible light two-dimensional image detector, whose photoconductive layer is made of an organic photoconductive material having photoconductivity (photoconductor). Examples of the organic photoconductive material include polymer compounds such as polyvinylcarbazol, polyacethylene, polyphenylene-vinylene, but the organic photoconductive material is not particularly limited as long as it is an organic compound that possesses a photoconductive function.

Incidentally, the organic compounds mentioned above are those which themselves can function as binders. Further, an inhibition layer that inhibits injection of various charges to the photoconductive layer 2 is preferably provided on either an upper surface or a lower surface of the photoconductive layer 2, or more preferably on both surfaces thereof, so as to make the photoconductive layer 2 have a diode configuration. The material forming the foregoing inhibition layer and the method for forming the same are not particularly limited.

The other configuring members (configuration) of the two-dimensional image detector in accordance with the present embodiment are identical to those of the two-dimensional image detector of the above-described second embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detector comprising, at least:
    an active matrix substrate having a plurality of pixel electrodes; and
    a photoconductive layer laminated on said pixel electrodes,
    wherein said photoconductive layer is made of a mixture of a particulate photoconductor and a binder containing a resin that renders volumetric shrinkage upon reaction.

2. The two-dimensional image detector as set forth in claim 1, wherein particles of said photoconductor have a diameter in a range of 0.01 $\mu$m through 0.5 $\mu$m.

3. The two-dimensional image detector as set forth in claim 1, wherein a ratio of said photoconductor to said binder is in a range of 50 percent by mass to 90 percent by mass.

4. The two-dimensional image detector as set forth in claim 1, wherein a radiation-resistant additive is added to said binder.

5. A two-dimensional image detector according to claim 1 wherein the particulate photoconductor is dispersed approximately uniformly throughout the photoconductive layer.

6. A method for fabricating a two-dimensional image detector comprising the steps of:
    laminating a photoconductive layer that is made of a mixture of a particulate photoconductor and a binder containing a resin that renders volumetric shrinkage upon reaction, on an active matrix substrate having a plurality of pixel electrodes.

7. The method as set forth in claim 6, wherein said laminating step includes the sub-step of causing volumetric shrinkage of said binder.

8. A method for fabricating a two-dimensional image detector according to claim 6 wherein the particulate photoconductor is dispersed approximately uniformly throughout the photoconductive layer.

* * * * *